United States Patent
Tsukamoto et al.

(10) Patent No.: US 6,727,027 B2
(45) Date of Patent: Apr. 27, 2004

(54) PHOTOMASK BLANK AND PHOTOMASK

(75) Inventors: Tetsushi Tsukamoto, Niigata-ken (JP);
Hideo Kaneko, Niigata-ken (JP);
Tamotsu Maruyama, Niigata-ken (JP);
Yukio Inazuki, Niigata-ken (JP);
Tsutomu Shinagawa, Niigata-ken (JP);
Satoshi Okazaki, Niigata-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 184 days.

(21) Appl. No.: 10/020,987

(22) Filed: Dec. 19, 2001

(65) Prior Publication Data

US 2002/0115003 A1 Aug. 22, 2002

(30) Foreign Application Priority Data

Dec. 26, 2000 (JP) ........................................ 2000-396138

(51) Int. Cl.$^7$ ................................................. G03F 9/00
(52) U.S. Cl. ........................................... 430/5; 428/432
(58) Field of Search ................... 430/5, 322; 428/426, 428/432

(56) References Cited

U.S. PATENT DOCUMENTS

| 4,363,846 A | 12/1982 | Kaneki | 428/203 |
|---|---|---|---|
| 4,374,912 A | 2/1983 | Kaneki et al. | 430/5 |
| 4,563,407 A | 1/1986 | Matsui et al. | 430/5 |
| 4,696,877 A | 9/1987 | Matsui et al. | 430/5 |
| 4,720,442 A | 1/1988 | Shinkai et al. | 430/5 |
| 5,230,971 A * | 7/1993 | Alpay | 430/5 |
| 5,955,223 A * | 9/1999 | Mitsui et al. | 430/5 |

FOREIGN PATENT DOCUMENTS

| EP | 0 054 736 A2 | 6/1982 |
|---|---|---|
| JP | 61-46821 B2 | 10/1986 |
| JP | 62-27386 B2 | 6/1987 |
| JP | 62-27387 B2 | 6/1987 |
| JP | 62-37385 B2 | 8/1987 |
| JP | 4-1339 B2 | 1/1992 |

OTHER PUBLICATIONS

English Abstract of JP 60095437 (publication date May 28, 1985).

* cited by examiner

*Primary Examiner*—S. Rosasco
(74) *Attorney, Agent, or Firm*—Birch, Stewart, Kolasch & Birch, LLP

(57) ABSTRACT

In the manufacture of a photomask blank, a seed layer of a chromium material containing oxygen, nitrogen and/or carbon is formed on a transparent substrate before a light-shielding film and an antireflective film are deposited thereon. Any film on the seed layer builds up in accordance with fine granular growth, and so the resulting photomask blank has an improved surface roughness, which enables high-sensitivity detection in the process of defect inspection and circuit pattern inspection. By lithographically patterning the photomask blank, a photomask is fabricated.

15 Claims, 2 Drawing Sheets

_US 6,727,027 B2_

PHOTOMASK BLANK AND PHOTOMASK

BACKGROUND OF THE INVENTION

1. Field of the Invention

The present invention relates to a photomask blank and a photomask for use in the fabrication of semiconductor integrated circuits and high-density integrated circuits.

2. Prior Art

Photolithographic processes involving the use of photomasks are employed in the fabrication of high-density semiconductor integrated circuits such as LSI and VLSI chips, color filters for charge-coupled devices and liquid-crystal displays, and magnetic heads.

Photomasks used for microfabrication are produced from a photomask blank composed of a transparent substrate such as quartz glass or aluminosilicate glass and a light-shielding film, typically in the form of a chromium film, deposited thereon by a sputtering or vacuum evaporation technique. The photomask is created by forming a specific pattern in the light-shielding film of the photomask blank.

The chromium-based light-shielding film has a high light reflectance. To prevent light which reflects back from the semiconductor substrate being exposed and passes through the projection lens from being reflected again by the photomask and returning to the semiconductor substrate, an antireflective coating is generally formed on the surface side, or both the surface and back sides, of the light-shielding film.

The photomask blanks from which photomasks are formed generally have two and three-layer structures. The two-layer structure photomask blanks include a light-shielding film, typically in the form of a chromium film, deposited on a synthetic quartz substrate by sputtering or vacuum evaporation, and an antireflective film deposited on the surface of the chromium film for preventing the exposure light reflected by the silicon wafer from being reflected again. The three-layer structure photomask blanks are arrived at by forming an additional antireflective film on the substrate side.

While a variety of photomask blanks are known in the art, JP-B 62-37385 discloses a photomask blank comprising a transparent substrate on which have been successively formed a chromium carbide-nitride film containing chromium carbide and chromium nitride as an underside antireflective coating, a chromium film as a light-shielding film, and a chromium oxide-nitride film containing chromium oxide and chromium nitride as a surface antireflective coating. The prior art also teaches the use of CrON (JP-B 61-46821 and JP-B 62-27387) and CrN (JP-B 62-27386 and JP-B 62-27387) as the antireflective coating. Also, a single-layer film of chromium nitride is disclosed in JP-B 4-1339.

As the level of integration and miniaturization of high-density semiconductor integrated circuits has continued to rise, the process of inspecting defects in photomask blanks and circuit patterns is now carried out at a high detection sensitivity. Accordingly, the light-shielding film and antireflective film are required to have a high uniformity of quality.

An important requirement of photomasks is that the substrate be flat to assure accurate transfer of the pattern. Yet, no matter how flat a substrate is used, forming a light-shielding chromium base film on the substrate tends to exacerbate the surface state, especially in the two-layer structure, because the light-shielding film is characterized by growth of large grains on the substrate surface. Since the current defect inspection and circuit pattern inspection technologies generally utilize light reflected or transmitted by the surface, the advanced inspection at a high detection sensitivity can detect a degraded surface state of film or rough surface as defects, which suggests the undesired prevention of high sensitivity inspection.

SUMMARY OF THE INVENTION

An object of the invention is to provide a high-performance photomask blank and photomask having a sufficient uniformity of film quality to accept high-sensitivity detection for the defect inspection and circuit pattern inspection and capable of accurately forming a desired micropattern without distortion.

The invention is directed to a photomask blank or photomask comprising a transparent substrate, at least one layer of light-shielding film and at least one layer of antireflective film both on the substrate. It has been found that when a seed layer is formed between the transparent substrate and the light-shielding film or the antireflective film, the light-shielding film or the antireflective film is improved in surface flatness whereby a photomask blank or photomask having uniformity of film quality is obtained.

The invention provides a photomask blank comprising a transparent substrate by which exposure light is transmitted, at least one layer of light-shielding film and at least one layer of antireflective film both on the substrate, and a seed layer disposed between the transparent substrate and the light-shielding film or the antireflective film. The seed layer is formed of a chromium material containing at least one of oxygen, nitrogen and carbon. Typically the seed layer has a thickness of 0.5 to 10 nm. Preferably, the light-shielding film or the antireflective film is formed of a chromium material containing at least one of oxygen, nitrogen and carbon. The photomask blank desirably has a surface roughness (RMS) of up to 0.9 nm.

Also contemplated herein is a photomask fabricated by lithographically patterning the photomask blank.

According to the invention, the seed layer on the transparent substrate presents growth nuclei for the light-shielding film or the antireflective film so that the film grows on the seed layer while creating fine grains. Then the interposition of the seed layer eventually endows the photomask blank or photomask with a reduced surface roughness.

BRIEF DESCRIPTION OF THE DRAWINGS

The above and other objects, features and advantages of the invention will become more apparent from the following description, taken in conjunction with the accompanying drawings.

FIG. 5C shows the blank after dry etching or wet etching.

DESCRIPTION OF THE PREFERRED EMBODIMENTS

Figure 1:
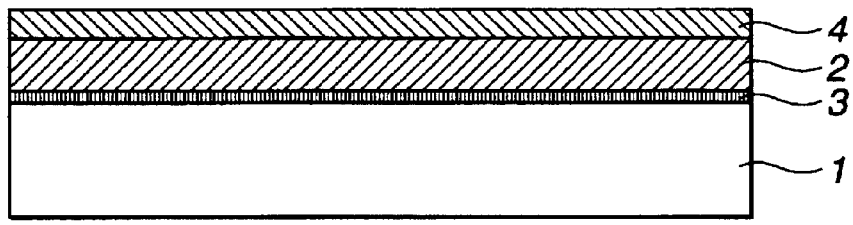
FIG. 1 is a sectional view of a photomask blank according to one embodiment of the invention.
Figure 3:
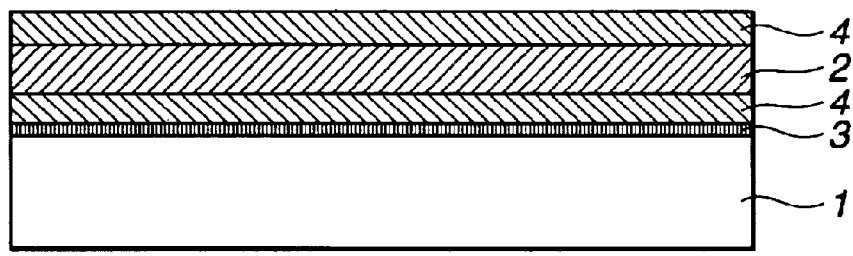
FIG. 3 is a sectional view of a photomask blank according to another embodiment of the invention.

Referring to FIGS. 1 and 3, the photomask blank of the invention includes a transparent substrate 1 by which exposure light is transmitted, at least one layer of light-shielding film 2 and at least one layer of antireflective film 4 on the substrate 1. A seed layer 3 is disposed between the transparent substrate 1 and the light-shielding film 2 or the antireflective film 4. The seed layer 3 is formed of a chromium material containing at least one of oxygen, nitrogen and carbon. The photomask blank is improved in surface flatness.

In the case of three-layer construction including the seed layer, one layer of light-shielding film and one layer of antireflective layer, it is preferred to arrange the layers such that the seed layer 3 lie on the substrate 1, the light-shielding film 2 lie on the seed layer 3, and the antireflective film 4 lie on the light-shielding film 2 as shown in FIG. 1.

In the case of four-layer construction including the seed layer, one layer of light-shielding film and two layers of antireflective layer, it is preferred to arrange the layers such that the seed layer 3 lie on the substrate 1, a first antireflective film 4 lie on the seed layer 3, the light-shielding film 2 lie on the first antireflective film 4, and a second antireflective film 4 lie on the light-shielding film 2 as shown in FIG. 3.

The substrate on which films are to be deposited is made of any desired material that is transparent to the exposure light, for example, preferably quartz, aluminosilicate glass, calcium fluoride or magnesium fluoride.

According to the invention, the seed layer is formed on the substrate. The seed layer is made of a chromium material containing at least one of oxygen, nitrogen and carbon, for example, such as chromium oxide, chromium nitride, chromium oxynitride, chromium oxycarbide, or chromium oxide nitride carbide, with the chromium oxycarbide and chromium oxide nitride carbide being preferred.

The chromium content of the seed layer is preferably 25 to 60 atom %, and especially 30 to 50 atom %. Specifically, chromium oxide nitride preferably has a nitrogen content of 2 to 50 atom %, especially 10 to 30 atom % and an oxygen content of 5 to 60 atom %, especially 20 to 50 atom %. Chromium oxide carbide preferably has a carbon content of 2 to 50 atom %, especially 5 to 25 atom % and an oxygen content of 5 to 60 atom %, especially 20 to 50 atom %. Chromium carbide nitride oxide preferably has a nitrogen content of 2 to 50 atom %, especially 5 to 25 atom %, a carbon content of 2 to 50 atom %, especially 5 to 25 atom %, and an oxygen content of 5 to 60 atom %, especially 20 to 50 atom %.

With respect to the thickness of the seed layer, the necessary minimum thickness to serve as initial growth nuclei in the range of 0.5 to 10 nm is preferred. A thickness of 0.5 to 5 nm is more preferred. A seed layer of less than 0.5 nm thick may be ineffective for improving surface roughness. A seed layer of more than 10 nm thick may achieve no additional improvement and take a longer time to deposit, resulting in low productivity.

The seed layer can be formed on the substrate surface by a reactive sputtering process using chromium as the target. The sputtering process may be one which employs a direct-current power supply (DC sputtering) or a high-frequency power supply (RF sputtering). Either a magnetron sputtering system or a conventional sputtering system may be used. The DC sputtering is advantageous because the mechanism involved is simple, and the magnetron sputtering system is preferred because film formation is more rapid, increasing productivity. The film-forming system may be either a continuous, in-line system or a single-workpiece processing system.

Illustratively, where a chromium oxide nitride (CrCO) film is deposited as the seed layer, the sputtering gases introduced into the sputtering chamber may be one each of a carbon-containing gas (e.g., $CH_4$, $CO_2$, and CO) and an oxygen-containing gas (e.g., $CO_2$ and $O_2$). Alternatively, a gas mixture obtained by mixing these gases with an inert gas (e.g., Ar, Ne and Kr) may be used. Using $CO_2$ gas or a mixture of $CO_2$ and an inert gas as the sputtering gas is especially advantageous partly for safety and partly for uniformity in quality of the CrCO film being deposited because the $CO_2$ gas can spread more broadly and uniformly throughout the chamber owing to its lower reactivity than oxygen or other suitable gases. Each of the sputtering gases may be introduced separately into the sputtering chamber.

Where a chromium oxide nitride carbide (CrCON) film is deposited as the seed layer, the sputtering gases introduced into the sputtering chamber may be one each of a carbon-containing gas (e.g., $CH_4$, $CO_2$, and CO), an oxygen-containing gas (e.g., $CO_2$ and $O_2$) and a nitrogen-containing gas (e.g., NO and $N_2$). Alternatively, a gas mixture obtained by mixing these gases with an inert gas (e.g., Ar, Ne and Kr) may be used. Using a mixture of $CO_2$ and $N_2$ or a mixture of $CO_2$, $N_2$ and an inert gas is especially advantageous partly for safety and partly for uniformity in quality of the CrCON film being deposited because the $CO_2$ gas can spread more broadly and uniformly throughout the chamber owing to its lower reactivity than oxygen or other suitable gases. Each of the sputtering gases may be introduced separately into the sputtering chamber.

The sputtering target need not be composed entirely of chromium so long as chromium is a major component. Examples of suitable targets include chromium targets which contain oxygen, nitrogen or carbon, and chromium targets to which a combination of oxygen, nitrogen and carbon has been added.

In forming the seed layer, sputtering is desirably carried out under a low pressure and at a high power. Under high power, low pressure conditions, sputtered particles have greater energy so that the proportion of sputtered particles obliquely landing on the substrate is reduced. This suppresses the shadow effect and ensures to deposit a seed layer with a minimized surface roughness. Preferred conditions include a pressure of 0.1 to 1.0 Pa, especially 0.25 to 0.32 Pa and a power of 3.9 to 11.0 $W/cm^2$, especially 7.0 to 9.0 $W/cm^2$.

For the light-shielding film and antireflective film, chromium materials containing at least one of oxygen, nitrogen and carbon are suitable. Examples include chromium oxide, chromium nitride, chromium oxynitride, chromium oxycarbide, and chromium oxide nitride carbide, with the chromium oxycarbide and chromium oxide nitride carbide being preferred. These materials may have well-known compositions.

Preferably, the light-shielding film is 10 to 150 nm thick, especially 50 to 80 nm thick, and the antireflective film is 10 to 100 nm thick, especially 20 to 40 nm thick.

The film structure in the photomask blank of the invention is not limited only to a chromium-based two-layer or three-layer film structure. For example, the photomask blank may have instead a four-layer film structure. The film structure may further include a phase shifter film which changes the phase of light at the exposure light wavelength. The photomask blank of the invention may be adapted for the production of not only transmission-type masks, but also reflection-type masks.

In a preferred embodiment, the photomask blank having the seed layer, light-shielding film and antireflective film stacked thereon has a surface roughness (RMS) of 0.9 nm or less, and especially 0.7 nm or less. Such a surface roughness can be accomplished by interposing the seed layer in the above-described manner.

Figure 2:
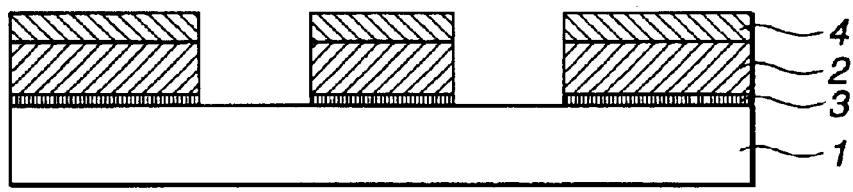
FIG. 2 is a sectional view of a photomask obtained from the photomask blank shown in FIG. 1.
Figure 4:
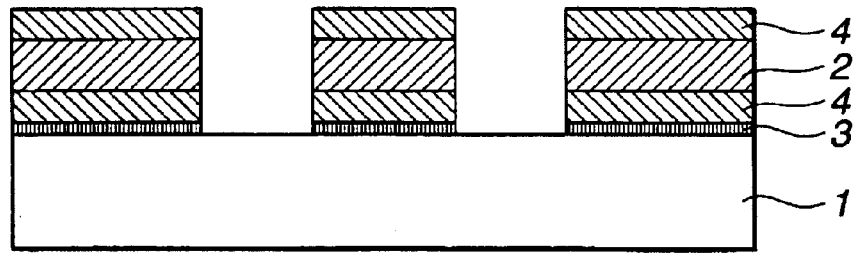
FIG. 4 is a sectional view of a photomask obtained from the photomask blank shown in FIG. 3.
Figure 5A:
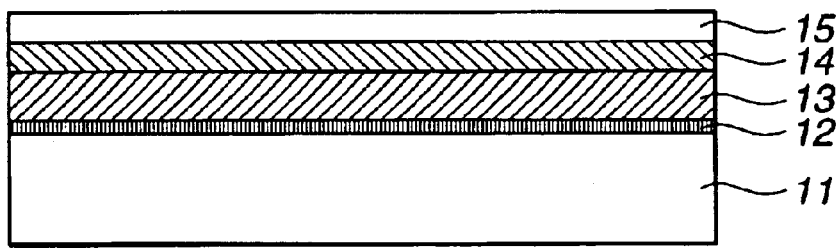
FIG. 5A shows a photomask blank on which a resist film has been formed.
Figure 5B:
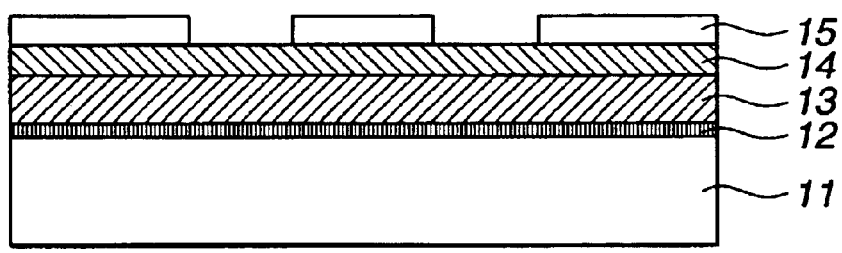
FIG. 5B shows the blank after the resist film has been patterned.
Figure 5C:
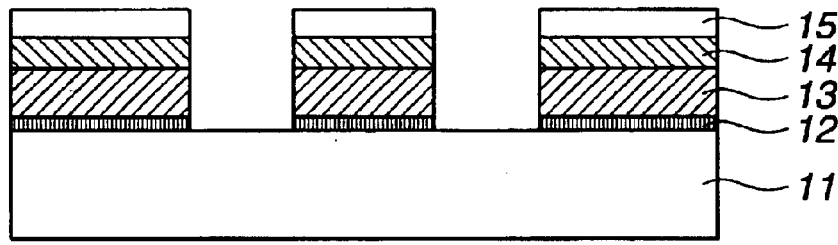
FIG. 5 is a series of schematic sectional views illustrating a photomask manufacturing method such as may be used in connection with the invention.
FIG. 5D shows the completed photomask after the resist film has been removed.
Figure 5D:
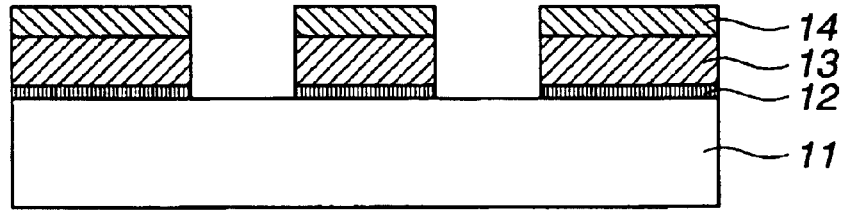

The inventive photomask blank constructed as above is then patterned by a lithographic process to give a photomask of the three or four-layer structure including the seed layer, light-shielding film and antireflective film as shown in FIG. 2 or 4.

More specifically, using the photomask blank of FIG. 1, the photomask of FIG. 2 may be manufactured by a process as shown in FIG. 5. After the seed layer 12, light-shielding film 13, and antireflective film 14 are successively formed on the transparent substrate 11, a resist film 15 is formed on the antireflective film 14 (FIG. 5A). The resist film 15 is then patterned (FIG. 5B). Next, the antireflective film 14, light-shielding film 13 and seed layer 12 are dry-etched or wet-etched through openings in the patterned resist film 15 (FIG. 5C). The resist film 15 is subsequently stripped (FIG. 5D). In this process, application of the resist film, patterning (exposure and development), dry or wet etching, and removal of the resist film may be carried out by known methods.

There has been described a photomask blank having a significantly improved surface flatness to accept high-sensitivity detection for the defect inspection and circuit pattern inspection and capable of accurately forming a desired micropattern. The resulting photomask can accommodate higher integration in semiconductor integrated circuits and related devices.

EXAMPLE

Examples of the invention are given below by way of illustration, and not by way of limitation.

Example 1

On a 6-inch quartz substrate, a CrCON film of 3 nm thick was deposited as the seed layer by DC sputtering. Metallic chromium was used as the target, and the gases passed through the system were Ar (32 sccm) as the sputtering gas and $CO_2$ (1.0 sccm) and $N_2$ (18 sccm) as the reactive sputtering gas. Other sputtering conditions included a gas pressure during discharge of 0.3 Pa and a power of 7.1 W/cm$^2$. The composition of the CrCON film was 48 atom % chromium, 9 atom % carbon, 17 atom % oxygen and 26 atom % nitrogen, as determined by electron spectroscopy for chemical analysis (ESCA).

Next, another CrCON film was deposited to a thickness of 70 nm on the seed layer (CrCON film) by DC sputtering. Chromium was used as the target, and the gases passed through the system were Ar (32 sccm), $CO_2$ (0.7 sccm) and $N_2$ (1 sccm). Other sputtering conditions included a gas pressure during discharge of 0.3 Pa and a power of 6.6 W/cm$^2$. The composition of the CrCON film was 63 atom % chromium, 8 atom % carbon, 20 atom % oxygen and 9 atom % nitrogen, as determined by ESCA.

A further CrCON film was deposited to a thickness of 25 nm on the CrCON film by DC sputtering. Chromium was used as the target, and the gases passed through the system were Ar (32 sccm), $CO_2$ (14 sccm) and $N_2$ (10 sccm). Other sputtering conditions included a gas pressure during discharge of 0.3 Pa, a power of 6.6 W/cm$^2$ and a temperature of 120° C. The composition of the CrCON film was 42 atom % chromium, 5 atom % carbon, 43 atom % oxygen and 10 atom % nitrogen, as determined by ESCA.

The surface roughness (RMS) of the thus obtained blank was determined over an area of 1 μm×1 μm using an atomic force microscope (NanoScope IIIa by Digital Instrument). The surface roughness was 0.395 nm.

Example 2

On a 6-inch quartz substrate, a CrCON film of 3 nm thick was deposited as the seed layer by DC sputtering. Metallic chromium was used as the target, and the gases passed through the system were Ar (32 sccm) as the sputtering gas and $CO_2$ (1.0 sccm) and $N_2$ (18 sccm) as the reactive sputtering gas. Other sputtering conditions included a gas pressure during discharge of 0.3 Pa and a power of 7.1 W/cm$^2$. The composition of the CrCON film was 48 atom % chromium, 9 atom % carbon, 17 atom % oxygen and 26 atom % nitrogen, as determined by ESCA.

Next, another CrCON film was deposited to a thickness of 25 nm on the seed layer (CrCON film) by DC sputtering. Chromium was used as the target, and the gases passed through the system were Ar (32 sccm), $CO_2$ (14 sccm) and $N_2$ (10 scam). Other sputtering conditions included a gas pressure during discharge of 0.3 Pa and a power of 6.6 W/cm$^2$. The composition of the CrCON film was 42 atom % chromium, 5 atom % carbon, 43 atom % oxygen and 10 atom % nitrogen, as determined by ESCA.

Next, a CrCO film was deposited to a thickness of 70 nm on the CrCON film by DC sputtering. Chromium was used as the target, and the gases passed through the system were Ar (32 scam) and $CO_2$ (0.7 sccm). Other sputtering conditions included a gas pressure during discharge of 0.3 Pa and a power of 6.6 W/cm$^2$. The composition of the CrCO film was 69 atom % chromium, 13 atom % carbon, and 18 atom % oxygen, as determined by ESCA.

A further CrCON film was deposited to a thickness of 25 nm on the CrCO film by DC sputtering, yielding a chromium base three-layer film. Chromium was used as the target, and the gases passed through the system were Ar (32 sccm), $CO_2$ (14 sccm) and $N_2$ (10 sccm). Other sputtering conditions included a gas pressure during discharge of 0.3 Pa and a power of 6.6 W/cm$^2$. The composition of the CrCON film was 42 atom % chromium, 5 atom % carbon, 43 atom % oxygen and 10 atom % nitrogen, as determined by ESCA.

The surface roughness of the blank was similarly determined to be 0.382 nm.

Comparative Example 1

Films were deposited as in Example 1 except that the seed layer was omitted. The blank had a surface roughness of 1.446 nm.

Comparative Example 2

Films were deposited as in Example 2 except that the seed layer was omitted. The blank had a surface roughness of 1.440 nm.

These data are tabulated below.

TABLE 1

| | Seed layer | Surface roughness (nm) |
|---|---|---|
| Example 1 | formed | 0.395 |
| Example 2 | formed | 0.382 |
| Comparative Example 1 | none | 1.446 |
| Comparative Example 2 | none | 1.440 |

It is evident that the blanks having a light-shielding film and an antireflective film formed on the seed layer have a significantly reduced surface roughness. A surface observation under AFM showed that the film on the seed layer consisted of grains with uniform size.

Since a light-shielding film and an antireflective film are formed on a seed layer on a transparent substrate according to the invention and any film builds up on the seed layer in accordance with fine granular growth, the resulting photomask blank has a reduced surface roughness. Then high-sensitivity detection is possible in the process of defect inspection and circuit pattern inspection. The resulting photomask of quality can accommodate further miniaturization and higher integration of semiconductor integrated circuits.

Japanese Patent Application No. 2000-396138 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A photomask blank comprising a transparent substrate by which exposure light is transmitted, at least one layer of light-shielding film and at least one layer of antireflective film both on the substrate, and a seed layer disposed between the transparent substrate and the light-shielding film or the antireflective film, said seed layer being formed of a chromium material containing at least one of oxygen, nitrogen and carbon, and said seed layer having a thickness of 0.5 to 5 nm.

2. The photomask blank of claim 1 wherein said light-shielding film or said antireflective film is formed of a chromium material containing at least one of oxygen, nitrogen and carbon.

3. The photomask blank of claim 1 having a surface roughness (RMS) of up to 0.9 nm.

4. A photomask fabricated by lithographically patterning the photomask blank of claim 1.

5. The photomask blank of claim 1, wherein said seed layer is a chromium oxide nitride, a chromium oxide carbide or a chromium oxide nitride carbide.

6. The photomask blank of claim 1, wherein said seed layer is a chromium oxide nitride having a chromium content of 25 to 60 atom %, a nitrogen content of 2 to 50 atom % and an oxygen content of 5 to 60 atom %.

7. The photomask blank of claim 1, wherein said seed layer is a chromium oxide nitride carbide having a chromium content of 25 to 60 atom %, a nitrogen content of 2 to 50 atom %, a carbon content of 2 to 50 atom % and an oxygen content of 5 to 60 atom %.

8. The photomask blank of claim 1, wherein said seed layer is a chromium oxide carbide having a chromium content of 25 to 60 atom %, a carbon content of 2 to 50 atom % and an oxygen content of 5 to 60 atom %.

9. The photomask blank of claim 1, having a surface roughness of 0.7 nm or less.

10. A method of manufacturing a photomask blank comprising a transparent substrate, at least one layer of light-shielding film and at least one layer of antireflective film both on the substrate, and a seed layer disposed between the transparent substrate and the light-shielding film or the antireflective film, said method comprising:

forming said seed layer on said transparent substrate by effecting reactive sputtering using a target of chromium or chromium containing at least one element of oxygen, nitrogen and carbon and a sputtering gas containing at least one each of a carbon-containing gas, a nitrogen-containing gas, an oxygen-containing gas, and optionally an inert gas, said seed layer having a thickness of 0.5 to 10 nm;

forming said light-shielding film; and forming said antireflective film.

11. The method of claim 10, wherein said seed layer has a thickness of 0.5 to 5 nm.

12. The method of claim 10, wherein said seed layer is a chromium oxide nitride, a chromium oxide carbide or a chromium oxide nitride carbide.

13. The method of claim 10, wherein said photomask blank has a surface roughness (RMS) of 0.9 nm or less.

14. The method of claim 10, wherein said photomask blank has a surface roughness (RMS) of 0.7 nm or less.

15. The method of claim 10, wherein said seed layer is formed at a pressure of 0.1 to 1.0 Pa and a power of 3.9 to 11.0 w/cm$^2$.

* * * * *